United States Patent [19]

Ungar

[11] Patent Number: 4,856,017
[45] Date of Patent: Aug. 8, 1989

[54] SINGLE FREQUENCY HIGH POWER SEMICONDUCTOR LASER

[75] Inventor: Jeffrey E. Ungar, Los Angeles, Calif.

[73] Assignee: Ortel Corporation, Alhambra, Calif.

[21] Appl. No.: 138,556

[22] Filed: Dec. 22, 1987

[51] Int. Cl.⁴ .................................................. H01S 3/10
[52] U.S. Cl. ........................................ 372/96; 372/20;
372/46; 372/32; 372/50
[58] Field of Search ...................... 372/96, 45, 46, 19,
372/20, 32, 50

[56] References Cited

U.S. PATENT DOCUMENTS 4,251,780 2/1981 Scifres et al. ........................ 372/46

Primary Examiner—James W. Davie
Attorney, Agent, or Firm—Christie, Parker & Hale

[57] ABSTRACT

A distributed feedback heterostructure semiconductor laser provides a single frequency at high power by having a wide output facet so that the power density at the output facet is low enough to avoid catastrophic optical mirror damage. Oscillation is obtained in the center of a pumped trapezoidal gain medium layer between the wide output facet and a relatively narrow rear facet. Stimulated emission of radiation in the balance of the pumped trapezoidal area produces high power output. At the opposite end of the gain layer from the output facet, a parallel edged, index guided pumped region of the gain layer provides a single transverse mode wave guide. A distributed feedback grating, preferably in the region with parallel sides, selects a single longitudinal oscillation mode independent of Fabry-Perot oscillation between the facets. Preferably, the output facet is anti-reflective for minimizing Fabry-Perot oscillation. Alternatively, the grating can be in an unpumped area aligned with the pumped area as a distributed Bragg reflector.

26 Claims, 3 Drawing Sheets

SINGLE FREQUENCY HIGH POWER SEMICONDUCTOR LASER

BACKGROUND OF THE INVENTION

This invention concerns a heterostructure semiconductor laser for producing much higher power levels of coherent radiation than heretofore available. By having distributed feedback in the laser, a single frequency without significant side bands is produced.

The power output of GaAlAs laser diodes have generally been limited to output powers of less than 50 milliwatts. There are various reasons for such limitations. For example, when the power density at the output facet of the laser is too high, there can be catastrophic optical mirror damage. This is believed to be due to the intense absorption of the laser radiation at the interface between the active layer and the air. Because of carrier depletion caused by highly efficient carrier recombination at the surface, the active layer material becomes absorptive, and the resulting temperature rise causes a localized drop in the semiconductive material band gap and increased absorption. The ensuing thermal runaway ends in sudden melting or spalling of the active layer at the facet.

The power density at which catastrophic mirror damage occurs can be increased by providing non-absorbing "windows" at the end of the active layer. A thin layer of material is provided between the active gain medium and the end facet. This material has a band gap larger than the energy of the laser radiation, and hence does not result in energy absorption.

Thermal saturation can also limit power output from a semiconductor laser. Temperature of the active layer may increase due to non-radiative carrier recombination, by absorption of both spontaneous and stimulated radiation, and by ohmic heating. As the temperature of the active layer rises, its gain coefficient falls, resulting in lower stimulated output for given injected current than would be the case at lower temperatures. A point is eventually reached for which an increase in current results in no increase in output power. There are ways of limiting thermal saturation by providing heat sinks that effectively withdraw heat from the active layer and by careful design to minimize ohmic heating. However, there are limits to what can be done for increasing power.

High power levels can also result in abrupt changes in the dominant transverse mode in the laser, resulting in "steering" of the output beam or appearance of side lobes in the far field pattern.

Various techniques have been employed for enhancing the power levels of semiconductor lasers. The non-absorbing facets to avoid catastrophic mirror damage have increased power outputs be an order of magnitude. Power densities of 25 megawatts per square centimeter have been obtained at the output facet. Continuous wave lasing of buried heterostructure devices only 1.2 micrometers wide have given power levels as high as 175 milliwatts. Similar devices without non-absorbing facets fail at only 10 milliwatts.

Alternatively, since mirror damage is caused by high power densities, if the power is spread over a large area of the facets, greater amounts of total power can be obtained. Simply widening the pumped region of the laser to hundreds of microns has proved unsuccessful because, instead of the entire pumped region lasing coherently, bright localized "filaments" form at random locations across the output facet, and their position and intensities vary widely with current. The resulting output of most broad area lasers is poorly coherent and not diffraction limited. Reproducibility of results are generally poor.

A variation of this approach is to try to phase lock arrays of lasers in the so-called "fundamental super mode" resulting in a single lobed far field. Although significant amounts of raw power can be obtained, the arrays show a strong tendency to double lobed output where separate laser stripes are out of phase with each other. Occasional satisfactory results are obtained, but reproducibility is low. Reliability tends to be low since there are several failure modes which can prevent arrays from performing satisfactorily.

Still another approach is to provide a relatively low power laser and optically couple it to an active optical amplifier. The quality of the output from the laser can be controlled since it is operated at power levels where high quality, coherent, diffraction limited output can be obtained. The beam is then passed through an active gain medium which does not have substantial oscillation, to amplify the power without severely degrading the beam. Some beam degradation is essentially inevitable. Such optical amplifiers can produce relatively high power levels since the power density at the output can be maintained at tolerable levels to prevent catastrophic mirror damage.

One type of laser amplifier which has been proposed comprises a diverging active gain layer similar to the active layer of the laser and having an input facet aligned with the output facet of the laser. The beam spreads by diffraction in the amplifier and the power density at the output facet of the amplifier is tolerable. Such a technique presents difficult fabrication problems since precise alignment is required between the laser output and amplifier input. Tolerances are in the order of a fraction of a micrometer.

Conventional semiconductor laser cavities do not emit radiation in a single longitudinal mode. Typically, there is a main frequency peak where much, if not most, of the radiation energy is concentrated. A few percent of the output power is carried by other longitudinal modes lying close to the gain peak. These decrease the power in the center frequency, particularly at high modulation rates. Further, the unwanted side modes limit the information transmission rate. A single stable longitudinal mode is desirable for communication where heterodyne demodulation is employed for enhancing the signal to noise ratio. A stable longitudinal mode is desirable for both the transmitter of radiation an for the local oscillator at the receiver.

It is, therefore, desirable to devise means for a semiconductor laser to emit radiation predominantly in a single longitudinal mode, even under high speed modulation. Such lasers are referred to as single-frequency lasers.

It is therefore desirable to provide a single high power laser which is not limited by catastrophic mirror damage at its output facet, which does not require precision manufacturing techniques beyond the current state of the art for semiconductor lasers, which provides a high quality, coherent, diffraction limited output beam, which has a single output frequency, which does not require precision control to avoid extraneous output modes, and which can be modulated at high frequency.

BRIEF SUMMARY OF THE INVENTION

There is, therefore, provided in practice of this invention according to a presently preferred embodiment, a semiconductor laser having an elongated active gain medium layer with a wide output facet at one end and a relatively narrower facet at the other end. Means are provided between the facets for providing frequency dependent feedback for the gain layer. The layer is pumped for stimulating emission of radiation, with the pumped area having parallel edges adjacent to the smaller facet and diverging toward the wider output facet. A diffraction grating formed in one of the layers of the laser is preferred for providing feedback distributed over at least a portion of the length of the gain medium. Preferably, the distributed feedback laser has index guiding in the parallel edged portion of the gain layer.

DRAWINGS

These and other features and advantages of the present invention will be appreciated as the same becomes better understood by reference to the following detailed description of a preferred embodiment when considered in connection with the accompanying drawings wherein.

DESCRIPTION

Figure 1:
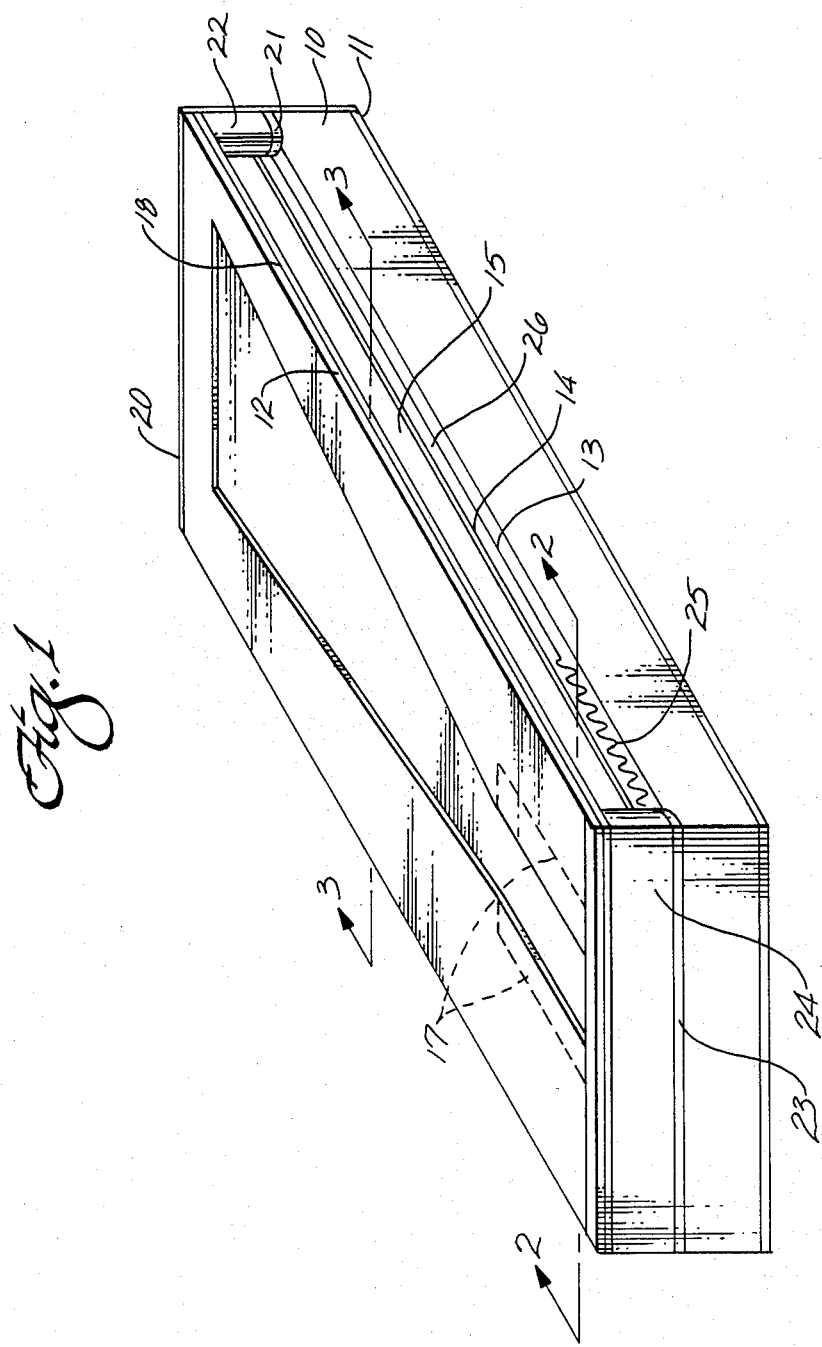
FIG. 1 is a semi-schematic isometric view of a high-power laser constructed according to principles of this invention.
Figure 2:
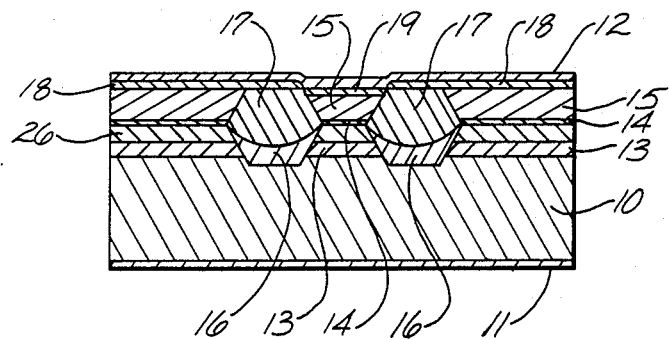
FIG. 2 is a transverse cross-section through the laser at line 2—2.
Figure 3:
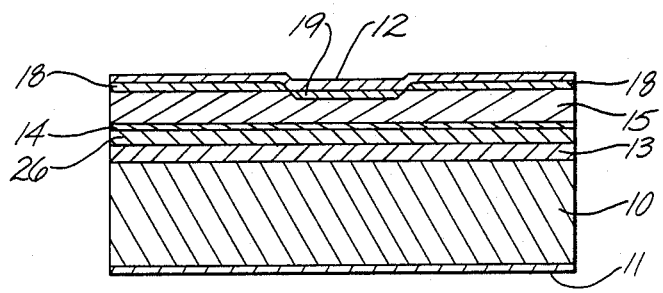
FIG. 3 is a transverse cross-section through the laser at line 3—3.

Buried heterostructure semiconductor lasers of doped gallium arsenide, gallium aluminum arsenide, indium gallium aluminum phosphide, indium phosphide, and other semiconductive materials are well known. This invention relates to the structure of such a laser and not to the materials of construction or fabrication techniques for such lasers. Such materials and techniques are conventional and well known to those skilled in the art. In this specification, materials and techniques are mentioned, and it will be understood that these are merely exemplary of materials and techniques that may be used for forming a high-power laser within the scope of this invention.

The semiconductor laser is formed on a substrate 10 of n-type gallium arsenide. A metal n-contact layer 11 is provided on the "bottom" face of the substrate. A metal p-contact layer 12 is provided on the "top" of the laser structure. It will be apparent that this structure is schematic in that the relative dimensions are exaggerated or reduced as needed for clarity. Some exemplary dimensions, as appropriate, are mentioned hereinafter. It will be understood that other dimensions are of conventional magnitude.

It also will be recognized that "top" and "bottom" are used herein solely for purposes of exposition to correspond with the orientation in the drawings. This orientation is not material for the laser. It is desirable, for example, to mount a high-power laser "junction side down" so that the active gain layer in which heating may be undesirable is in good thermal contact with a heat sink for minimizing temperature rise.

A n-GaAlAs lower cladding layer 13 is formed on the gallium arsenide substrate. The lower cladding layer is then masked and a portion is photolithographically removed using a conventional holographic or electron beam technique. A diffraction grating 25 is then etched into the lower cladding layer. The grating is in the form of periodic ridges and grooves having their length extending normal to the length of the laser.

A large optical cavity layer 26 of n-GaAlAs is grown over the lower cladding layer, including the portion of the lower cladding layer in which the diffraction grating is etched. In an exemplary embodiment the optical cavity layer has a thickness of from $\frac{1}{2}$ to $\frac{3}{4}$ micrometer.

An active gain medium layer 14 is formed on top of the large optical cavity layer. The active gain layer may be formed of any of a number of well known gain media. The gain layer may be suitably doped gallium aluminum arsenide or gallium arsenide, or may be a "quantum well" type of active gain layer, for example. The active layer is topped off with a p-GaAlAs upper cladding layer 15.

In an exemplary embodiment, the upper and lower cladding layers may each be about 1.5 micrometers thick. The thickness of the active layer may be from a few tens of angstroms to about 2,000 angstroms thick, depending on its desired properties and materials. These layers may be grown by conventional metal organic chemical vapor deposition (MOCVD). Other techniques for growing laser quality epitaxial material are liquid phase epitaxy and molecular beam epitaxy. Growth by MOCVD techniques is preferred.

After these layers are grown, the wafer is masked by photolithography, and parallel channels are chemically etched through the cladding layers, optical cavity layer, and active layer to the gallium arsenide substrate along each edge of a desired heterostructure mesa. A p-GaAlAs confining layer 16 and n-GaAlAs confining layer 17 are successively grown in each of the channels by liquid phase epitaxy. This technique is preferred since the confining layer material grows only on the gallium arsenide floor of the channel after the GaAlAs layers have been exposed to air.

Next, an insulating layer 18 of silicon dioxide is deposited on the top surface of the chip. Openings are photolithographically defined in the regions that are to be pumped. A zinc diffusion layer 19 is formed through these openings through the insulating layer to form a degenerately doped electrical contact. This contact layer is overlaid by the top p-contact metal layer 12.

In operation the laser emits radiation from the gain layer through the end of the chip hidden in FIG. 1. This end is referred to herein as the output facet. The end of the chip nearer the viewer in FIG. 1 is referred to as the rear facet. Such facets are conventionally formed by cleaving the single crystal semiconductor. Although the entire end of the chip is commonly referred to as the facet, "facets" as used herein refers to that portion of the end of the chip at an end of the pumped region of the gain layer. Thus, the rear facet is narrower than the output facet insofar as the width of the gain layer through which radiation passes is concerned.

A novel feature of this invention concerns the geometry of the area of active gain medium pumped by passing current therethrough. The pumped area can be identified in FIG. 1 of the drawings by the recessed area on the top of the chip. This corresponds to the opening etched through the silicon dioxide insulating layer which is overlain by the p-contact metal layer 12. It should be recalled that the dimensions in this drawing are exaggerated as compared with an actual chip. The thickness of the silica layer, and hence the depth of the recess, is only a few thousand Angstroms.

The confining layers 16 and 17 extend parallel to each other a short distance from the region of the rear facet toward the output facet. These confining layers form a reverse bias junction which prevents current flow through the confining layers on each edge of the mesa of gain medium near the rear facet. The index of refraction of the confining layers is also less than the index of refraction of the active gain medium. Thus, the confining layers serve as an index guide for a parallel edged stripe of active gain medium. This serves as a wave guide for radiation in the stripe of gain medium. In an exemplary embodiment the mesa may be about 250 micrometers long and one to two micrometers wide.

At the ends of the confining layers nearer the output facet of the laser the edges of the pumped portion of the gain medium begin to diverge from the end of the narrow stripe toward the output facet. The angle of divergence approximates the diffraction angle in the gain medium, of radiation from the end of the narrow stripe of gain medium.

A non-absorbing "window" is provided at each end facet of the laser. The front window at the output facet comprises a layer of p-GaAlAs 21 on the GaAs substrate, overlain by a layer of n-GaAlAs 22. Similarly, the rear window comprises an underlying layer 23 of p-GaAlAs and an overlying layer of 24 of n-GaAlAs. The silicon dioxide layer 18 and top metal layer 12 overlie the windows at each end of the laser. Each of the windows forms a reverse bias junction similar to the confining layers 16, 17, and in fact, the windows are formed at the same time as the confining layers. The windows have a sufficiently different band gap that they do not absorb the laser radiation. Thus, the potential for catastrophic mirror damage at the facets of the laser are largely mitigated. A window is employed at the output facet so that the power density transmitted through the facet may be enhanced without catastrophic mirror damage. A window may be provided at the rear facet since this facet may also be subjected to high power densities and susceptible to catastrophic mirror damage without the protection provided by the window.

It is desirable to coat the output facet with an anti-reflection layer 20, such as a ¼ wavelength layer of aluminum oxide. In the event an anti-reflection coating is not used on the output facet, a conventional passivation layer is applied for more protection of the chip from its environment. The rear facet also receives a passivation coating. Reflection from the output facet may also be minimized by making the output facet substantially transparent. Minimizing reflection from the output facet suppresses Fabry-Perot oscillations for higher selectivity of a single longitudinal mode in the laser.

If desired, the rear facet may be provided with a reflective layer (not shown) for minimizing power emitted from that facet. For example, such a reflective layer may be provided by coating the entire rear facet of the chip with a dielectric stack having alternating layers of aluminum oxide and silicon, each of which has a thickness of ¼ wavelength of the laser radiation in such material. The effect of reducing reflectivity of one facet relative to the other may be to improve mode selectivity.

In the illustrated embodiment the grating is formed in the portion of the laser with parallel edges. The grating period is determined by well known relations between the Bragg diffraction and the wavelength of radiation in the gain medium. The period is selected to have a lower lasing threshold for the gain medium spectrum than the Fabry-Perot lasing threshold. The grating employed in practice of this invention is the same as used in distributed feedback (DFB) semiconductor lasers.

This portion of the laser acts like a DFB laser in selecting a single longitudinal mode for the stimulated radiation. As radiation travels through the gain medium, some of the optical mode profile extends into the optical cavity layer 26 which has an index of refraction between the indices of the gain medium and the cladding layer. The field of the radiation therefore interacts with the grating and reinforces radiation with a wavelength corresponding to that of the periodic structure of the grating. With such a buried heterostructure DFB laser, side mode suppression in the order of 30 db relative to the main lasing mode may be obtainable. If desired, the grating can be extended through at least a portion of the diverging area of the laser for maintaining high selectivity of the oscillating frequency. It is desirable to have enough grating length and low enough reflectivity from the end facets, that the frequency selectivity of the grating greatly predominates over Fabry-Perot resonance between the end facets. In other words, the single output frequency from the laser is determined by the periodicity of the grating and is independent of Fabry-Perot modes between the facets at the ends of the laser. This makes it desirable to have an anti-reflective coating on at least the front facet of the high power DFB laser for high mode selectivity.

The stripe of gain layer near the rear facet is similar to a conventional buried heterostructure laser. The central stripe of gain medium with its etched grating provides the double heterostructure waveguide section of the laser, flanked on each edge by the reverse bias confining layer junctions 16, 17. The confining layers give effective current confinement and their lower index of refraction provides strong optical index guiding.

Radiation from the end of the buried heterostructure section of the laser enters the portion having diverging edges because the radiation is no longer guided by the confining layers 16, 17. It diffracts outwardly toward the sides of the chip. The portion of the gain layer between the diverging edges corresponding to the diffraction angle are pumped, and thereby provide gain for the radiation passing therethrough. The portions of the gain layer outside of the diffraction angle, and including the regions between the confining layers and the edges of the chip, are unpumped since overlain by the insulating layer of silicon dioxide. Any radiation entering the unpumped portion (such as by reflection from the output facet) is strongly absorbed.

Although it is preferred to have an anti-reflective coating on the output facet, it should be noted that this is not an essential feature for operation of the DFB laser. Typical reflectivities of uncoated facets are in the order of 30%. A laser with such uncoated facets may operate satisfactorily.

The radiation entering the diverging section of the laser is coherently amplified as it passes through the pumped region from the end of the buried heterostructure DFB section to the output facet. During this single passage through the diverging pumped region it maintains the coherency characteristics forced by waveguide nature of the buried heterostructure section.

In an exemplary embodiment the diverging section of the laser may have a length in the order of two to three millimeters. The width of the output facet is in the order of ¼ to ¾ millimeter. Thus, although the output beam is single lobe and diffraction limited, it is highly astigmatic. This astigmatism is easily corrected with conventional cylindrical lenses and prisms (not shown).

A semiconductor laser as hereinabove described and illustrated may be operated in a pulse mode by intermittently applying a current to the metal contact layers. Such a laser may also be operated continuous wave by continuous pumping. Further, such a laser may be modulated at desired frequencies up to several gigahertz by modulating the pumping current. Because of the distributed feedback provided by the grating, the frequency of modulation can be high without introducing unwanted side modes of any significant magnitude.

Figure 4:
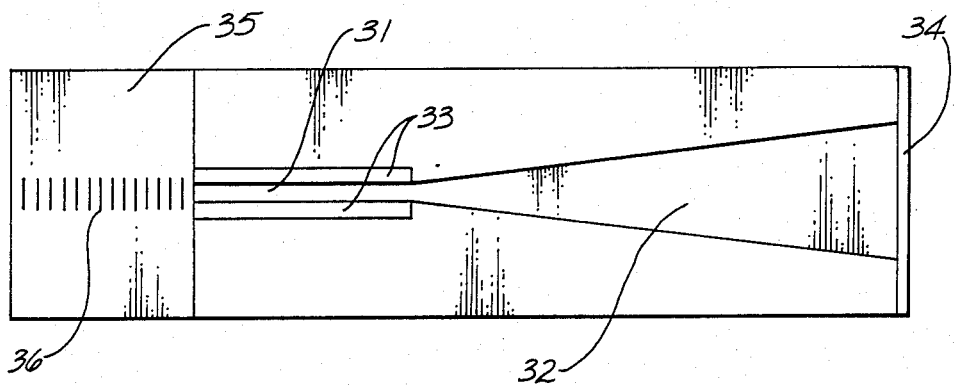
FIG. 4 is a schematic longitudinal cross section of a distributed Bragg reflector embodiment of semiconductor laser.

FIG. 4 illustrates schematically another embodiment of single longitudinal mode or single frequency laser employing a diffraction grating for selecting a specific oscillation frequency. This type of laser is referred to as a distributed Bragg reflector (DBR) laser. In this embodiment the pumped area of the active gain medium has a region 31 having parallel edges and an elongated trapezoidal region 32 having edges diverging from the end of the region with parallel edges. This first region is bounded along each parallel edge with a confining layer 33 much as described above. The output facet of the laser has a non-absorbing window 34, and if desired may have an anti-reflection coating (not shown).

At the opposite end of the parallel edged portion of the pumped region of the gain layer, there is a reflector layer 35 of n-GaAlAs similar to the window at the rear facet of the embodiment hereinabove described, but of greater length. The reflector layer is actually highly transparent to the radiation from the waveguide section 31 of the laser, and radiation is, in effect, reflected by a diffraction grating 36 parallel to the plane of the gain layer. The grating is etched into a lower cladding layer (not shown) which is overlain by an optical cavity layer (not shown) as hereinabove described. The optical cavity layer is overlain by the reflectivity layer.

Such a structure is similar to a distributed Bragg reflector laser. The diffraction grating and the output facet act somewhat analogously to the mirrors of a Fabry-Perot cavity except that the diffraction grating will reflect only a single wavelength. Thus, a single longitudinal mode is established in the laser. The wave guide section assures a single transverse mode. If desired a second diffraction grating can be provided in a window at the output facet of the laser. Further, since there may be coupling losses between the unpumped and pumped regions along the axis of the laser, means may be employed for enhancing optical power coupling instead of the abrupt transition illustrated schematically herein.

The DBR laser is desirable for high frequency modulation since the grating is outside the active gain medium. Thus, there is no change in index of refraction by carrier injection and "chirping" can be minimized or eliminated.

It will be recognized that both the DFB and DBR lasers involve single frequency distributed feedback. In the DFB laser the diffraction grating is associated with the pumped gain layer, preferably in the wave guide section. In the DBR laser the diffraction grating is associated with an unpumped region, preferably a substantially transparent window region at the end of the waveguide section, or with transparent windows at each end of the elongated pumped layer.

Figure 5:
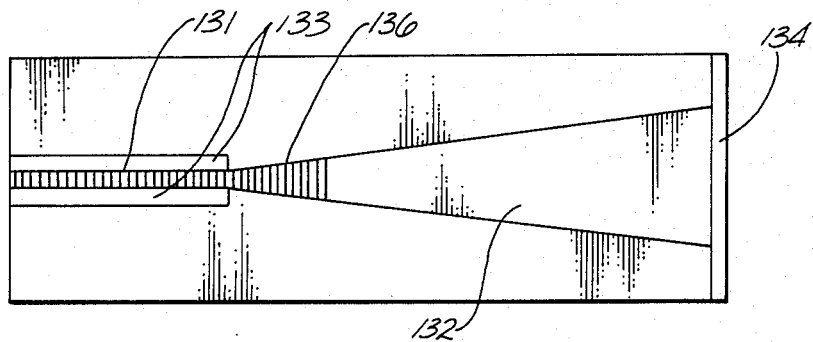
FIG. 5 is a schematic longitudinal cross-section of another embodiment of semiconductor laser having a distributed Bragg reflector.

FIG. 5 illustrates schematically another embodiment of single longitudinal mode laser employing a diffraction grating for selecting a specific oscillation frequency. The pumped area of the active gain medium has a region 131 having parallel edges and an elongated trapezoidal region 132 having edges diverging from the end of the region with parallel edges. This first region is bounded along each parallel edge with a confining layer 133. The output facet of the laser has a non-absorbing window 134. A distributed feedback grating 136 extends at least part way through the area 131 having parallel edges and into the trapezoidal area for selecting a single longitudinal oscillation mode of radiation.

Although specific embodiments of distributed feedback laser oscillators have been described herein, many modifications and variations will be apparent to one skilled in the art. The embodiment described and illustrated has an index guided resonant cavity near the rear facet and diverging edges of the pumped area between the wave guide section and the output facet. Limiting the pumped area to the diffraction angle of the beam from the index guided section is not required. For example, a generally rectangular pumped section may be used between the wave guide section and the output facet, although no advantage as yet been recognized for such a shape, and pumping in areas outside the diffraction angle represents current flow without concomitant useful amplification.

In the illustrative embodiment the mode selecting waveguide section of the laser is immediately adjacent to the window at the rear facet. If desired, a pumped, unguided region of the active gain medium layer may be left between the waveguide section and the rear facet. No advantage is presently known for such a structure.

The index guided waveguide section of the laser may be appreciably shorter than the exemplary 250 micrometers. All that is required is assurance of single transverse mode oscillation in the laser cavity. The length of the wave guide section of the laser may be reduced to essentially zero. In such an embodiment the laser is essentially a V-shaped, gain guided laser with a relatively narrow rear facet at the point of the V and a relatively wider output facet at the other end. The divergence angle of such a V-shaped laser is preferably the diffraction angle from the small rear fact near the point of the V. In the absence of parallel sided guiding in such a laser, there may be insufficient suppression of unwanted transverse modes for some applications of the laser.

In an embodiment where the length of the straight waveguide section of the laser is reduced to zero, there is pumping of an elongated symmetrical trapezoidal area of the gain layer. The grating is then in the trapezoidal area of the laser. The non-pumped, non-parallel edges of the trapezoidal area tend to suppress transverse modes since the edges do not form a Fabry-Perot cavity and the non-pumped gain medium is highly absorbing of transverse radiation. There is, in effect, a longitudinally symmetrical trapezoidal semiconductor laser with the edges diverging at the diffraction angle from the narrower of the parallel ends. In the event greater selectivity of transverse oscillation is desired, a parallel edged waveguide section can be provided between the smaller end of the trapezoid and the rear facet, as in the preferred embodiment.

In the illustrated embodiment the entire trapezoidal area of the gain layer is pumped. If desired, the area can be divided into a fan-like array of alternating, roughly triangular stripes. Alternate stripes of this area are pumped, with the intervening stripes being unpumped. Such a fan-shaped array of pumped stripes may be advantageous for its lower pumping threshold. Any decrease in power due to decreased pumped area may be at least offset by increased pumping current. This is feasible because heat dissipation per unit area from the pumped stripes is enhanced as compared to having the entire trapezoidal area pumped.

Further, index guiding is not essential although highly desirable in a distributed feedback laser. The waveguide portion may be gain guided, which eliminates some of the fabrication steps. Many other modifications and variations will be apparent to one skilled in the art and it is therefore to be understood that, within the scope of the appended claims, the invention may be practiced otherwise then as specifically described.

What is claimed is:

1. A semiconductor laser comprising:
   an elongated active gain medium layer;
   a relatively narrower rear facet at one end of the gain layer;
   a relatively wider output facet at the other end of the gain layer;
   means adjacent to only the rear facet for pumping a parallel edged portion of the gain layer for stimulated emission of radiation in a mode selecting waveguide portion of the gain layer;
   means for pumping a portion of the gain layer between the parallel edged portion and the output facet for stimulated emission of radiation; and
   a radiation diffraction grating extending normal to the length of the pumped portion of the gain layer for selecting a single longitudinal mode of laser oscillation.

2. A semiconductor laser is recited in claim 1 wherein the rear facet has a relatively higher reflectivity and the output facet is substantially transparent.

3. A semiconductor laser as recited in claim 1 wherein the edges of the pumped portion of the gain layer diverge from the mode selecting waveguide portion toward the output facet.

4. A semiconductor laser as recited in claim 1 comprising means along the waveguide portion for index guiding radiation therein.

5. A semiconductor laser as recited in claim 1 further comprising a non-absorbing window between the end of the pumped portion of the gain layer and the output facet.

6. A semiconductor laser as recited in claim 5 further comprising a non-absorbing window between the waveguide section and the rear facet.

7. A semiconductor laser as recited in claim 6 wherein the diffraction grating is associated with the window adjacent the rear facet.

8. A semiconductor laser as recited in claim 1 wherein the diffraction grating is associated with the parallel edged portion of the gain layer.

9. A heterostructure semiconductor laser comprising:
   an elongated active gain medium layer;
   a relatively narrower rear facet at one end of the gain layer;
   a relatively wider output facet at the other end of the layer;
   means for pumping the gain medium for stimulated emission of radiation in an area having parallel edges adjacent to the rear facet and having edges diverging from the ends of the parallel edges toward the output facet; and
   means between the facets for selecting a single longitudinal oscillation mode independent of Fabry-Perot oscillation modes.

10. A semiconductor laser as recited in claim 9 comprising means along the parallel edges for index guiding radiation in the gain medium.

11. A semiconductor laser as recited in claim 9 further comprising a non-absorbing window between the end of the pumped portion of the gain layer and the output facet.

12. A semiconductor laser as recited in claim 9 wherein the means for selecting a single oscillation mode comprises a distributed feedback grating.

13. A semiconductor laser as recited in claim 12 wherein the distributed feedback grating is at least partly in the area having parallel edges.

14. A heterostructure semiconductor laser comprising:
   an elongated active gain medium layer;
   a relatively narrower rear facet at one end of the layer;
   a relatively wider output facet at the other end of the layer;
   means for pumping the gain layer for stimulated emission of radiation in an area having edges diverging from the vicinity of the rear facet toward the output facet; and
   a distributed feedback grating in a pumped area of the gain layer for selecting a single longitudinal oscillation mode.

15. A laser as recited in claim 14 comprising means for pumping the gain layer in an elongated area having parallel edges between the narrower end of the diverging area and the rear facet.

16. A semiconductor laser as recited in claim 14 wherein the grating is at least in part in the area having parallel edges.

17. A semiconductor laser as recited in claim 14 wherein the diverging edges diverge at approximately the diffraction angle of radiation from the area having parallel edges.

18. A semiconductor laser as recited in claim 14 further comprising a non-absorbing window between the end of the pumped portion of the gain layer and the output facet.

19. A semiconductor laser as recited in claim 14 comprising means for pumping the gain layer in an elongated area having parallel edges between the narrower end of the diverging area and the rear facet, and means for index guiding radiation in the elongated area having parallel edges.

20. A heterostructure semiconductor laser comprising:
   an active gain medium layer;
   means for making electrical contact with one face of the gain layer;
   means for making electrical contact with the opposite face of the gain layer only in an area having a first region with edges diverging from a narrower end toward a wider end and a second region having parallel edges extending from the narrower end of the diverging region for passing current through the so-defined area of the gain layer; and means for selecting a single longitudinal oscillation mode of radiation in the area of the gain layer through which current passes.

21. A semiconductor laser as recited in claim 20 wherein the means for selecting a single mode comprises a distributed feedback grating.

22. A distributed feedback heterostructure semiconductor laser comprising:

an active gain medium layer;

means for pumping an elongated symmetrical trapezoidal area of the gain layer for stimulating radiation therein;

a distributed feedback grating in the trapezoidal area for selecting a single longitudinal oscillation mode of radiation in the pumped area of the gain layer; and a non-pumped area of the gain layer lying along each non-parallel edge of the trapezoidal area.

23. A semiconductor laser as recited in claim 22 comprising means for pumping an area of the gain layer having parallel edges extending away from the trapezoidal area and normal to the smaller parallel edge of the trapezoidal area.

24. A semiconductor laser as recited in claim 22 wherein the grating is at least in part in the area having parallel edges.

25. A heterostructure semiconductor laser comprising:

an elongated active gain medium layer;

a relatively narrower rear facet at one end of the gain layer;

a relatively wider output facet at the other end of the layer;

means for pumping the gain medium for stimulated emission of radiation in an area having parallel edges adjacent to the rear facet and having edges diverging from the ends of the parallel edges toward the output facet; and a diffraction grating forming at least one facet of the laser for selecting a single longitudinal oscillation mode.

26. A semiconductor laser as recited in claim 25 wherein the diffraction grating forms the rear facet of the laser.

* * * * *